United States Patent
Park et al.

(10) Patent No.: US 7,869,286 B2
(45) Date of Patent: Jan. 11, 2011

(54) SEMICONDUCTOR MEMORY DEVICE AND METHOD FOR OPERATING THE SAME

(75) Inventors: Jung-Hoon Park, Gyeonggi-do (KR); Young-Ho Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 73 days.

(21) Appl. No.: 12/346,074

(22) Filed: Dec. 30, 2008

(65) Prior Publication Data

US 2010/0165758 A1 Jul. 1, 2010

(30) Foreign Application Priority Data

Dec. 29, 2008 (KR) ...................... 10-2008-0135516

(51) Int. Cl.
*G11C 7/00* (2006.01)
(52) U.S. Cl. .............. 365/193; 365/189.05; 365/230.06
(58) Field of Classification Search .................. 365/193, 365/191, 189.011, 189.05, 233.1, 230.06
See application file for complete search history.

(56) References Cited

U.S. PATENT DOCUMENTS

| | | | | |
|---|---|---|---|---|
| 6,480,439 | B2 * | 11/2002 | Tokutome et al. | 365/189.15 |
| 7,545,189 | B2 * | 6/2009 | Ku | 327/158 |
| 7,636,273 | B2 * | 12/2009 | Lee et al. | 365/230.06 |
| 2002/0039323 | A1 * | 4/2002 | Tokutome et al. | 365/233 |
| 2005/0007835 | A1 * | 1/2005 | Lee et al. | 365/189.12 |
| 2006/0161745 | A1 * | 7/2006 | Lee et al. | 711/154 |

\* cited by examiner

*Primary Examiner*—Gene N. Auduong
(74) *Attorney, Agent, or Firm*—IP & T Group LLP

(57) ABSTRACT

The semiconductor memory device includes a data input/output unit configured to input data synchronously with a data clock and to output the data to a memory cell in response to an output strobe signal; and an output strobe signal generation unit configured to output the output strobe signal, wherein the output strobe signal is synchronized with a system clock in response to a write command regardless of whether the semiconductor memory device is in a write training mode.

24 Claims, 12 Drawing Sheets

SEMICONDUCTOR MEMORY DEVICE AND METHOD FOR OPERATING THE SAME

CROSS-REFERENCE TO RELATED APPLICATION

The present invention claims priority to Korean patent application number 10-2008-0135516, filed on Dec. 29, 2008, which is incorporated by reference in its entirety.

FIELD OF THE INVENTION

The present invention relates to a semiconductor memory device, and more particularly, to a semiconductor memory device for performing a write training operation.

BACKGROUND OF THE INVENTION

A conventional semiconductor memory device typically outputs data at a storage cell position corresponding to an address inputted from a data processing device, such as a memory controller, according to a read command of the data processing device. Furthermore, the conventional semiconductor memory device writes the data inputted from the data processing device at a storage cell position corresponding to the address inputted from the data processing device according to a write command of the data processing device. Conventional semiconductor memory devices are designed to perform write and read operations at high speeds.

In general, semiconductor memory devices are typically evaluated according to the speeds at which they are able to perform the write and read operations. Particularly, the amount of time that the semiconductor memory devices require to process a large amount of data, such as an image, is a very important performance index. In addition, the accuracy with which a system operates stably to transmit the data outputted from the semiconductor memory device, is another important performance index.

A recently developed semiconductor memory device has been designed to input and output 2-bit data between a rising edge and a falling edge of an externally applied system clock CLK, in order to input and output the data at a high speed. Namely, the recently developed semiconductor memory device has been designed to input and output 4-bit data during one period of the system clock CLK. For this, a data clock WCLK having a frequency that is two times higher than that of the system clock is employed in the semiconductor memory device.

In other words, the recently developed semiconductor memory device is able to input and output the 4-bit data during one period of the system clock CLK by using the system clock CLK to receive an address and a command from an external source and by using the data clock WCLK to input and output the data.

FIG. 1 is a diagram illustrating a write operation of a conventional semiconductor memory device.

As shown in FIG. 1, a frequency of a data clock WCLK is two times higher than that of a system clock CLK and the conventional semiconductor memory device receives data DATA corresponding to a write command after synchronizing the data with a rising edge and a falling edge of the data clock WCLK. At this time, the semiconductor memory device is able to accurately receive the data DATA, only when the rising edge and the falling edge of the data clock WCLK exist within a valid window of the data DATA. The valid window is represented by 'UI' in the drawing.

Meanwhile, due to the data clock WCLK and a physical delay factor in a data transmitting process, the rising and falling edges of the data clock WCLK may not exist within the valid window of the data DATA and in this case, the semiconductor memory device may receive inaccurate data. Particularly, as the valid window UI of the data becomes smaller and the amount of data increases in a high speed operation system, it becomes increasingly difficult to stably transmit the data.

Recently, conventional semiconductor memory devices have been able to overcome this problem and transmit data at high speeds through data training. The data training includes read training and write training and is a technology that is capable of adjusting a skew between the data and the data clock WCLK by using a predetermined training pattern between a memory controller and the semiconductor memory device in order to stably transmit the data for a read operation and a write operation. A recently suggested semiconductor memory device is designed for high-speed data transmission of more than 4 Gbps and performs the data training to secure reliability of a high-speed operation.

SUMMARY OF THE INVENTION

Embodiments of the present invention are directed to providing a semiconductor memory device capable of detecting a data output error due to domain crossing which occurs in a normal write operation, in a write training operation.

In accordance with an aspect of the present invention, there is provided a semiconductor memory device, including a data input/output unit configured to input data synchronously with a data clock and to output the data to a memory cell in response to an output strobe signal; and an output strobe signal generation unit configured to output the output strobe signal, in which the output strobe signal is synchronized with a system clock in response to a write command regardless of whether the semiconductor memory device is in a write training mode.

In accordance with another aspect of the present invention, there is provided a semiconductor memory device, including a data input/output unit configured to receive and store data in response to an input strobe signal and to output the stored data to a memory cell in response to an output strobe signal; a clock dividing unit configured to output multi-phase clocks by dividing a data clock; a data input control unit configured to output the input strobe signal, wherein the input strobe signal is synchronized with the multi-phase clocks in response to a write enable signal; and an output strobe signal generation unit configured to output the output strobe signal, wherein the output strobe signal is synchronized with a system clock in response to the write enable signal regardless of whether the semiconductor memory device is in a write training mode.

In accordance with still another aspect of the present invention, there is provided a method for operating a semiconductor memory device, including generating a write enable signal and a write training signal enabled in a write training mode in response to a write command; generating a core enable signal, wherein the core enable signal is synchronized with a system clock in response to the write enable signal regardless of whether the semiconductor memory device is in the write training mode; generating an output strobe signal by delaying the core enable signal by a predetermined time; disabling the core enable signal based on the write training mode in order to transmit the disabled core enable signal to a memory cell, wherein the memory cell is enabled by the enabled core enable signal; generating multi-phase clocks by dividing a data clock; generating an input strobe signal synchronized with the multi-phase clocks in response to the write enable signal; and receiving and storing data in response to the input strobe signal and outputting the stored data to the memory cell in response to the output strobe signal.

DESCRIPTION OF SPECIFIC EMBODIMENTS

In order to describe in detail such that those skilled in the art can easily implement the spirit and scope of the present invention, the embodiments of the present invention will be described with reference to the accompanying drawings.

Figure 1:
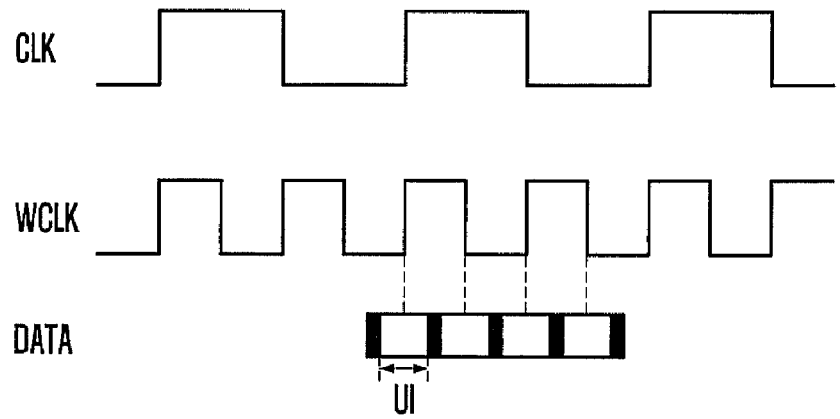
FIG. 1 is a timing diagram illustrating a write operation of a conventional semiconductor memory device.
Figure 2:
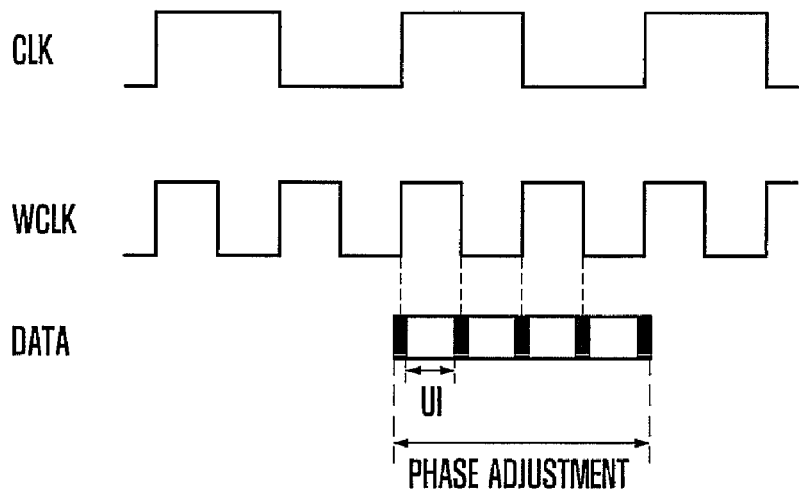
FIG. 2 is a timing diagram illustrating conventional write training.

FIG. 2 is a diagram illustrating conventional write training.

The write training is training for adjusting a phase difference between a data clock WCLK and data DATA such that a semiconductor memory device can accurately receive the data DATA.

As shown, in case that a rising edge and a falling edge of the data clock WCLK do not exist within a valid window UI of the data DATA, the semiconductor memory device is unable to accurately receive the data DATA. Therefore, a memory controller adjusts a phase of the data DATA in a write training process such that the rising edge and the falling edge of the data clock WCLK exist within the valid window of the data DATA, whereby the semiconductor memory device is able to accurately receive the data DATA. After the write training, the semiconductor memory device is able to accurately receive the data in a normal write state. The normal write state means a state in which the semiconductor memory device receives and stores the data from the memory controller after a write training state is finished.

More specifically, since in a write training operation, it is performed only to check whether the semiconductor memory device accurately receives the data DATA or not. In one regard, the data DATA inputted to the semiconductor memory device is not stored in the semiconductor memory device and outputted outside the semiconductor memory device through a read path. And, the memory controller receives data outputted through the read path and compares the received data with the data DATA inputted to the semiconductor memory device. The memory controller adjusts the phase of the data DATA which is inputted to the semiconductor memory device in order to match the data DATA inputted to the semiconductor memory device with the data outputted from the semiconductor memory device.

Finally, through the write training, the rising edge and the falling edge of the data clock WCLK may exist within the valid window of the data DATA and the semiconductor memory device may receive the data DATA with an optimal setup/hold characteristic in a normal write operation state.

Meanwhile, before performing the write training operation, the semiconductor memory device performs clock training. The clock training is performed to match phases of a system clock CLK and the data clock WCLK by adjusting the phase of the data clock WCLK. As described above, since the semiconductor memory device performs the operations of inputting and outputting the data DATA in response to a command that is synchronized with the system clock CLK and the data DATA are inputted and outputted by being synchronized with the data clock WCLK, matching of the phases of the system clock CLK and the data clock WCLK is required through the clock training.

Figure 3:
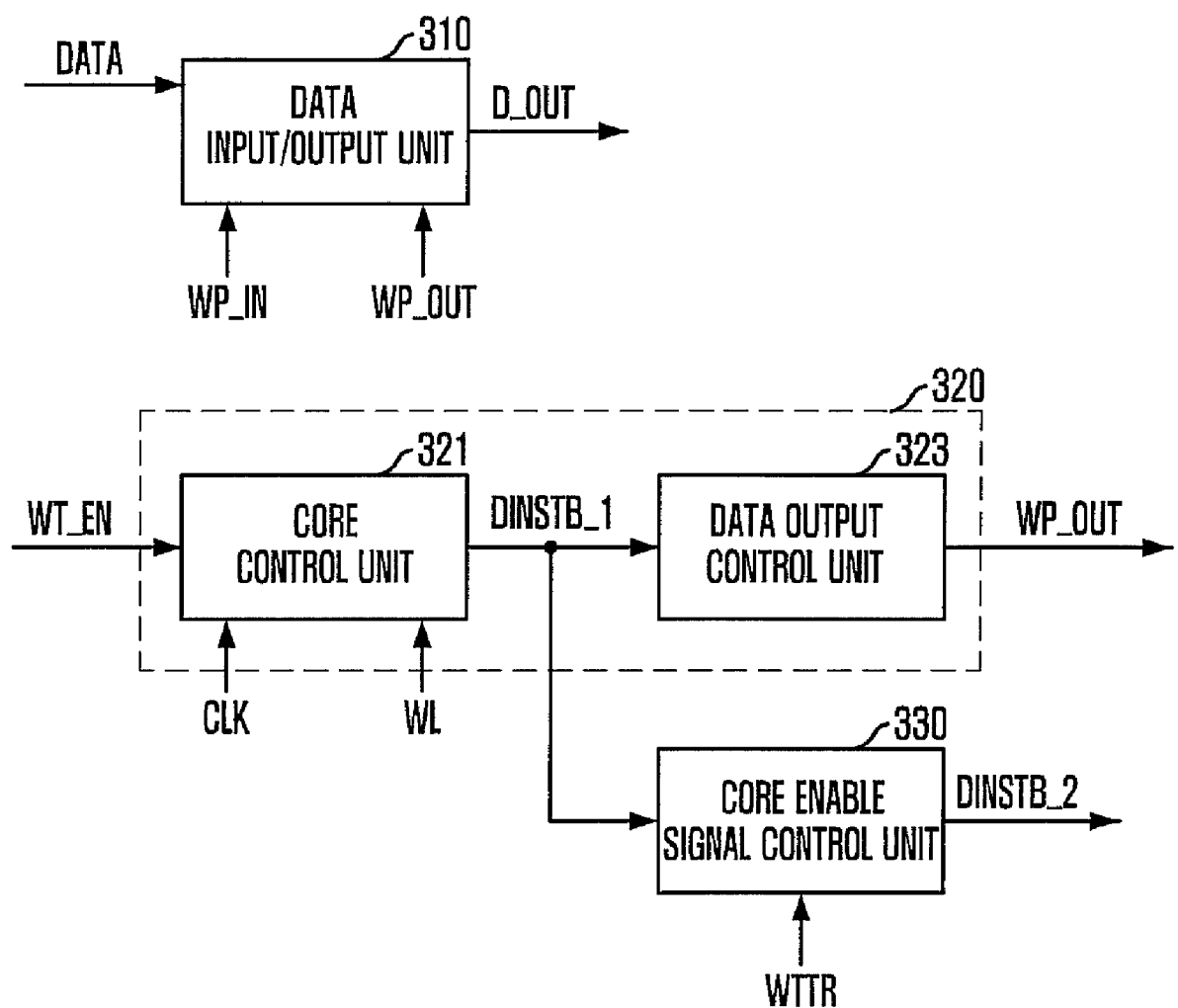
FIG. 3 is a diagram showing a semiconductor memory device performing a write training operation in accordance with one embodiment of the present invention.

FIG. 3 is a diagram showing a semiconductor memory device performing the write training operation in accordance with one embodiment of the present invention.

As shown, the semiconductor memory device in accordance with the present invention includes a data input/output unit 310, an output strobe signal generation unit 320, and a core enable signal control unit 330.

The data input/output unit 310 is enabled in response to an input strobe signal WP_IN, which is enabled in the write training operation or the normal write operation in order to receive and store the data DATA. The data DATA is inputted to the data input/output unit 310 by being synchronized with the rising edge and the falling edge of the data clock WCLK. Since the data DATA are inputted by being synchronized with the data clock WCLK, the input strobe signal WP_IN is also generated by being synchronized with the data clock WCLK.

And, the data input/output unit 310 outputs the stored data to a memory cell (not shown) in response to an output strobe signal WP_OUT outputted by the output strobe signal generation unit 320.

The output strobe signal generation unit 320 generates the output strobe signal WP_OUT, which is synchronized with the system clock CLK in response to a write command regardless of whether the semiconductor memory device is in a write training mode. The output strobe signal generation unit 320 includes a core control unit 321 and a data output control unit 323.

The core control unit 321 generates a first core enable signal DINSTB_1, which is synchronized with the system clock CLK in response to a write enable signal WT_EN, which is enabled in the write training operation and the normal write operation, i.e., when the write command is applied. The memory cell stores data D_OUT outputted by the data input/output unit 310 in response to the enabled first core enable signal DINSTB_1. For instance, a write driver included in the memory cell receives and amplifies the data D_OUT outputted by the data input/output unit 310 in response to the first core enable signal DINSTB_1 in order to output the amplified data.

The data output control unit 323 delays the first core enable signal DINSTB_1 by a predetermined time DD in order to output it as the output strobe signal WP_OUT. Since a predetermined time is needed for the data input/output unit 310 to receive and store the data DATA in response to the input strobe signal WP_IN, the data output control unit 323 delays the first core enable signal DINSTB_1 by the predetermined time DD in order to output it as the output strobe signal WP_OUT.

The output strobe signal WP_OUT is generated by being synchronized with the system clock CLK in the write training operation and the normal write operation. The output strobe signal WP_OUT is delayed from the first core enable signal DINSTB_1 by the predetermined time DD. But, since the first core enable signal DINSTB_1 is synchronized with the system clock CLK, the output strobe signal WP_OUT is also a signal that is synchronized with the system clock CLK.

The reason why the output strobe signal WP_OUTP is synchronized with the system clock CLK in the normal write operation is that, as described above, an address, the command, and so on for controlling the memory cell of the semiconductor memory device are synchronized with the system clock CLK. In other words, since the data D_OUT outputted by the data input/output unit 310, are stored in the memory cell by being controlled by the address, the command, and so on, which are synchronized with the system clock CLK, the data input/output unit 310 needs to output the data D_OUT such that it is synchronized with the system clock CLK in response to the output strobe signal WP_OUT being synchronized with the system clock CLK.

As described above, in the data input/output unit 310, domain crossing occurs because that data DATA that is inputted as being synchronized with the data clock WCLK is outputted by being synchronized with the system clock CLK. That is, a clock with which the data is synchronized is changed from the data clock WCLK to the system clock CLK.

Meanwhile, in accordance with the present invention, the output strobe signal WP_OUT is synchronized with the system clock CLK even in the write training operation. As described above, the data D_OUT outputted from the data input/output unit 310 is not stored in the memory cell in the write training operation. However, in the semiconductor memory device in accordance with the present invention, the domain crossing occurs even during the write training operation in order to correct an error, such as, the data input/output unit 310 outputting incorrect data due to the domain crossing.

Hereafter, a case in which the data input/output unit outputs the incorrect data due to the domain crossing, will be described in detail.

Even if the phases of the system clock CLK and the data clock WCLK are matched through the clock training, thereafter, due to physical and external delay factors, the phases of the system clock CLK and the data clock WCLK may not be matched. In the event that the normal write operation is performed in a state where the phases of the system clock CLK and the data clock WCLK are not matched, e.g., the phase of the system clock CLK is in advance of the phase of the data clock WCLK, an enable time of the output strobe signal WP_OUT is in advance of an enable time of the input strobe signal WP_IN, whereby the data DATA inputted to the data input/output unit 310 may not be accurately outputted due to the domain crossing. The data, which are not accurately outputted, are outputted to the memory controller through the read path and the memory controller is able to detect that incorrect data has been outputted.

Namely, in accordance with the present invention, a detection that the incorrect data has been outputted in a domain crossing operation due to phase mismatch between the system clock CLK and the data clock WCLK in the clock training operation may be made. Therefore, in this case, if the phases of the system clock CLK and the data clock WCLK are matched by performing the clock training again, the storing of incorrect data in the memory cell due to the phase mismatch between the system clock CLK and the data clock WCLK in the normal write operation, may be prevented.

Meanwhile, the core control unit 321 may delay and output the first core enable signal DINSTB_1 according to Write Latency (WL). An operation of the core control unit 321 related to the write latency WL will be described in detail with reference to FIG. 4 herein below.

The core enable signal control unit 330 disables the first core enable signal DINSTB_1 in response to a write training signal WTTR in order to output it as a second core enable signal DINSTB_2. The write training signal WTTR is a signal that is enabled in the write training mode.

As described above, since the data is not stored in the memory cell in the write training mode, the core enable signal control unit 330 disables the second core enable signal DINSTB_2 in the write training mode in order to output the second core enable signal DINSTB_2 to the memory cell. That is, the first core enable signal DINSTB_1 is enabled in both the normal write mode and the write training mode, but the core enable signal control unit 330 outputs the second core enable signal DINSTB_2, which is enabled only in the normal write mode.

Meanwhile, the core enable signal control unit 330 delays the first core enable signal DINSTB_1 by a predetermined time DD and outputs it as the second core enable signal DINSTB_2 in order to match the timing between the data D_OUT outputted from the data input/output unit 310 and the second core enable signal DINSTB_2 in the memory cell.

In summary, in the semiconductor memory device in accordance with the present invention, the domain crossing is generated in both the normal write operation and the write training operation. Therefore, in case that the wrong data is outputted in the domain crossing operation due to the phase mismatch between the system clock CLK and the data clock WCLK, the error may be detected in the write training operation performed before the normal write operation and the phases of the system clock CLK and the data clock WCLK may be matched through the clock training.

Finally, the present invention may prevent incorrect data from being outputted in the domain crossing operation due to the phase mismatch between the system clock CLK and the data clock WCLK in the normal write operation.

Figure 4:
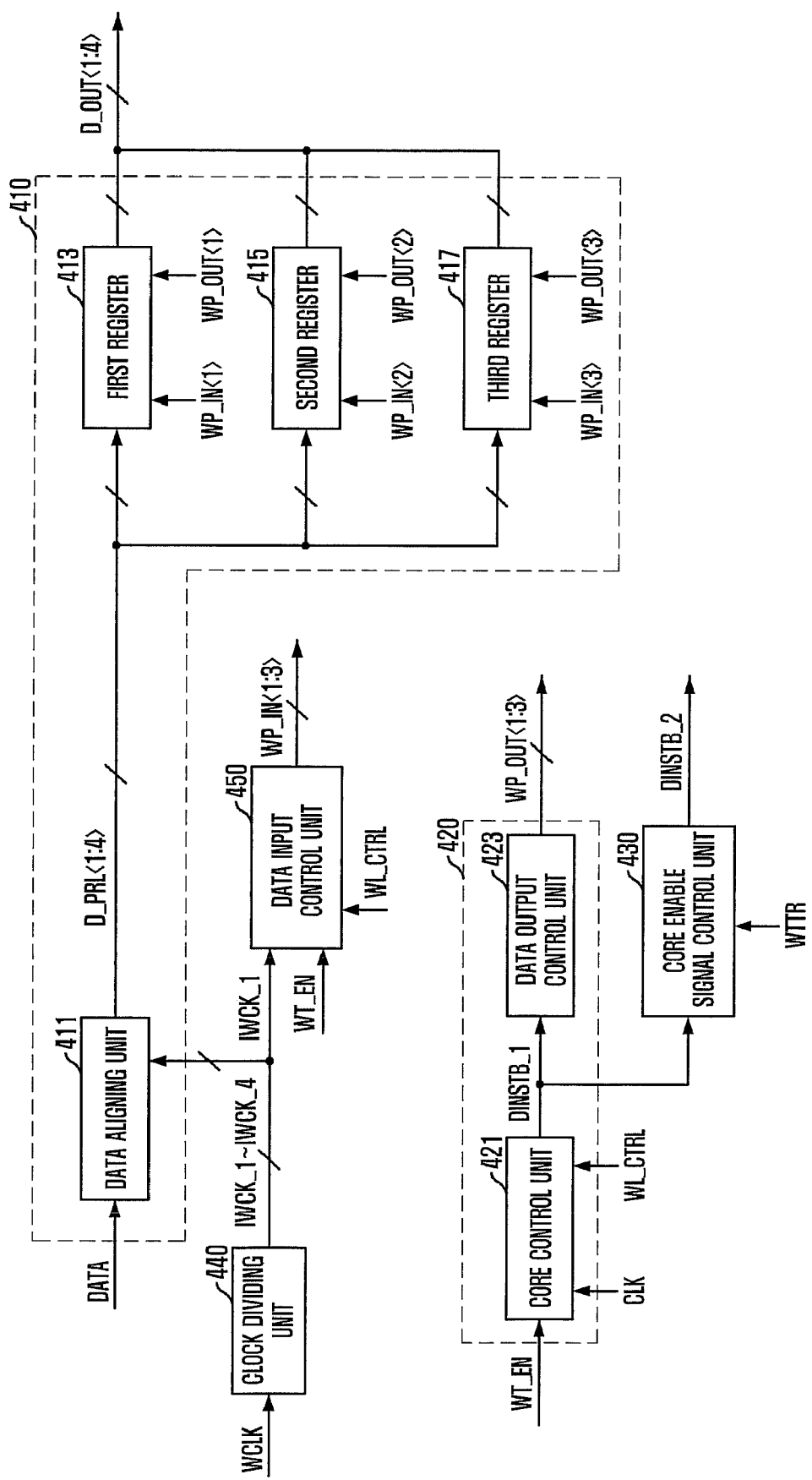
FIG. 4 is a detailed diagram showing the semiconductor memory device in accordance with the one embodiment of the present invention.

FIG. 4 is a detailed diagram showing the semiconductor memory device in accordance with the one embodiment of the present invention.

As shown, the semiconductor memory device in accordance with the present invention includes a data input/output unit, 410, an output strobe signal generation unit 420, a core enable signal control unit 430, a clock dividing unit 440, and a data input control unit 450.

The semiconductor memory device using a 4-bit prefetch method is shown in FIG. 4 as one embodiment.

Although not shown in the drawing, a command decoder unit receives a write command CMD inputted from an external source in order to output a write enable signal WT_EN and a write training signal WTTR, which are synchronized with a system clock CLK. The write enable signal WT_EN is enabled in a normal write operation and a write training operation and the write training signal WTTR is enabled only in the write training operation.

The clock dividing unit 440 divides the data clock WCLK in two and outputs multi-phase clocks IWCK_1 to IWCK_4 which have phase differences from adjacent clocks by 90°. That is, if the phases of the system clock CLK and the data clock WCLK are matched, a phase of the multi-phase clock IWCK_1 is matched with a phase of the system clock and a phase of each of the other multi-phase clocks IWCK_2 to IWCK_4 is different from the phase of the multi-phase clock IWCK_1 by 90°, 180°, and 270°. The multi-phase clocks, IWCK_1 to IWCK_4, aligned at edges of the data clock WCLK are inputted to the data input/output unit 410.

As described above, the data input/output unit 410 receives data DATA by being synchronized with the data clock WCLK. Since the multi-phase clocks IWCK_1 to IWCK_4 are aligned at the edges of the data clock WCLK and are clocks obtained by dividing the data clock WCKL in two, the data input/output unit 410 can easily receive the data DATA synchronized with the data clock WCLK by using the multi-phase clocks IWCK_1 to IWCK_4.

The data input/output unit 410 includes a data aligning unit 411 and first to third resistors 413, 415, and 417.

The data aligning unit 411 receives the data DATA in response to the multi-phase clocks IWCK_1 to IWCK_4 in order to align them in parallel data D_PRL<1:4>. In accordance with one embodiment of the present invention, the data aligning unit 411 receives 4-bit data continuously inputted during one period of the system clock CLK at the rising edges of the multi-phase clocks IWCK_1 to IWCK_4 in order to align them in the parallel data D_PRL<1:4> by using the 4-bit prefetch method.

In other words, the continuously inputted 4-bit data are sequentially inputted and stored in the data aligning unit 411 in response to the rising edges of the multi-phase clocks IWCK_1 to IWCK_4. The first data transmitted from the memory controller is inputted to the data aligning unit 411 in response to the rising edge of the multi-phase clock IWCK_1 of which a phase advances first and the last data transmitted from the memory controller is inputted to the data aligning unit 411 in response to the rising edge of the multi-phase clock IWCK_4 of which a phase advances last. After all of the 4-bit data is inputted, the data aligning unit 411 latches the 4-bit data in response to the rising edge of the multi-phase clock IWCK_1 of which the phase advances first again in order to align the data in the parallel data, D_PRL<1:4>.

Each of the first to the third resistors 413, 415, and 417 receives and stores the parallel data D_PRL<1:4> in response to each input strobe signal WP_IN<1:3> which is outputted by the data input control unit 450 and sequentially enabled. That is, the first resistor 413 stores the parallel data D_PRL<1:4> in response to the input strobe signal WP_IN<1> and the second and third resistors 415 and 417 store the parallel data D_PRL<1:4> in response to the input strobe signals WP_IN<2:3>, which are enabled later than the input strobe signal WP_IN<1>. And, the first to the third resistors 413, 415, and 417 output the stored parallel data to the memory cell in response to the output strobe signals WP_OUT<1:3>, which are outputted by the output strobe signal generation unit 420 and sequentially enabled.

The data input/output unit 410 may be constructed by including one of the first to the third resistors 413, 415, and 417, in which the semiconductor memory device may continuously receive the data by including a plurality of resistors. If the data input/output unit 410 includes the first resistor 413, the semiconductor memory device can not continuously receive the data because the parallel data D_PRL<1:4>, aligned by the data aligning unit 411 can not be stored in the first resistor 413 until the parallel data stored in the first resistor 413 is outputted. Meanwhile, if the data input/output unit 410 includes the first to the third resistors 413, 415, and 417, the semiconductor memory device can continuously receive the data because the data input/output unit 410 can store the data in the second and third resistors 415 and 417, although the data of the first resistor 413 is not outputted.

Meanwhile, the data aligning unit 411 may be constructed to receive the data DATA by being enabled in response to the input strobe signals WP_IN<1:3> according to a desired design. In addition, the data input/output unit 410 may include resistors in addition to the first to the third resistors 413, 415, and 417.

The data input control unit 450 generates the input strobe signals WP_IN<1:3>, which are synchronized with the multi-phase clock IWCK_1 in response to the write enable signal WT_EN. In other words, the data input control unit 450 first enables the input strobe signal WP_IN<1>, when the write enable signal WT_EN is first enabled and enables the input strobe signal WP_IN<2>, when the write enable signal WT_EN is enabled again in order to sequentially generate the enabled input strobe signals WP_IN<1:3>. And, since the multi-phase clock IWCK_1 is synchronized with the data clock WCLK, the input strobe signals WP_IN<1:3> are synchronized with the data clock WCLK.

The data input control unit 450 generates the input strobe signals WP_IN<1:3> by reflecting write latency WL in response to a write latency signal WL_CTRL having write latency information. The write latency WL means a time until the data input/output unit 410 receives the data after a write command CMD corresponding to the write enable signal WT_EN is inputted from an external source. If the write latency WL is N (where "N" is a natural number), the data DATA is inputted to the data input/output unit after a N period of the system clock CLK after inputting the write command CMD. The write latency signal WL_CTRL can be generated in a Mode Resistor Set (MRS).

Hereafter, a relation between the data input control unit 450 and the data input/output unit 410 will be described in brief.

The data DATA is inputted to the data input/output unit 410, after a time corresponding to the write latency WL from a time when the write command CMD is inputted. The data aligning unit 411 receives the data DATA in order to align them in the parallel data D_PRL<1:4>. The data input control unit 450 reflects the write latency in response to the write latency signal WL_CTRL in order to output the input strobe signals WP_IN<1:3>. And, the first to the third resistors 413, 415, and 417 receive and store the parallel data D_PRL<1:4> in response to the input strobe signals WP_PN<1:3>.

Although the write command CMD is inputted and before the data DATA is inputted after the write latency WL, the incorrect data is inputted to the data aligning unit 411, the input strobe signals WP_IN<1:3> are enabled after the write latency. Thus, the incorrect data inputted to the data aligning unit 411 is not stored in the first to the third resistors 413, 415, and 417.

Referring to FIG. 4 again, the output strobe signal generation unit 420 includes a core control unit 421 and a data output control unit 423.

The core control unit 421 generates the first core enable signal DINSTB_1 which is synchronized with the system clock in response to the write enable signal WT_EN. The first core enable signal DINSTB_1 is a base of the output strobe signals WP_OUT<1:3>. Also, the output strobe signals WP_OUT<1:3> should not be enabled prior to the input strobe signals WP_IN<1:3>. Thus, the first core enable signal DINSTB_1 is generated by being reflected by the write latency WL like the input strobe signals WP_IN<1:3>.

The data output control unit 423 delays the first core enable signal DINSTB_1 by a predetermined time DD in order to generate the output strobe signals WP_OUT<1:3>. Like the input strobe signals WP_IN<1:3>, the output strobe signals WP_OUT<1:3> are sequentially enabled.

The core enable signal control unit 430 disables the first core enable signal DINSTB_1 in response to the write training signal WTTR in order to output it as the second core enable signal DINSTB_2. The second core enable signal DINSTB_2 is inputted to the memory cell. The core enable signal control unit 430 delays the first core enable signal DINSTB_1 by a predetermined time DD in order to output it as the second core enable signal, such that timing between the data outputted from the data input/output unit 410 and the second core enable signal DINSTB_2 is matched. The core enable signal control unit 430 can further delay the first core enable signal DINSTB_1 according to timing when the data are outputted from the data input/output unit 410.

In accordance with the present invention, domain crossing occurs in the data input/output unit 410, accurately, i.e., the first to the third resistors 413, 415, and 417 even in the write training operation. Therefore, in case that the incorrect data is outputted from the data input/output unit 410 due to the domain crossing in the write training operation, if the phases of the system clock CLK and the data clock are matched through the clock training again, output of the incorrect data due to the phase mismatch between the system clock CLK and the data clock WCLK in the normal write operation may be prevented.

Figure 5:
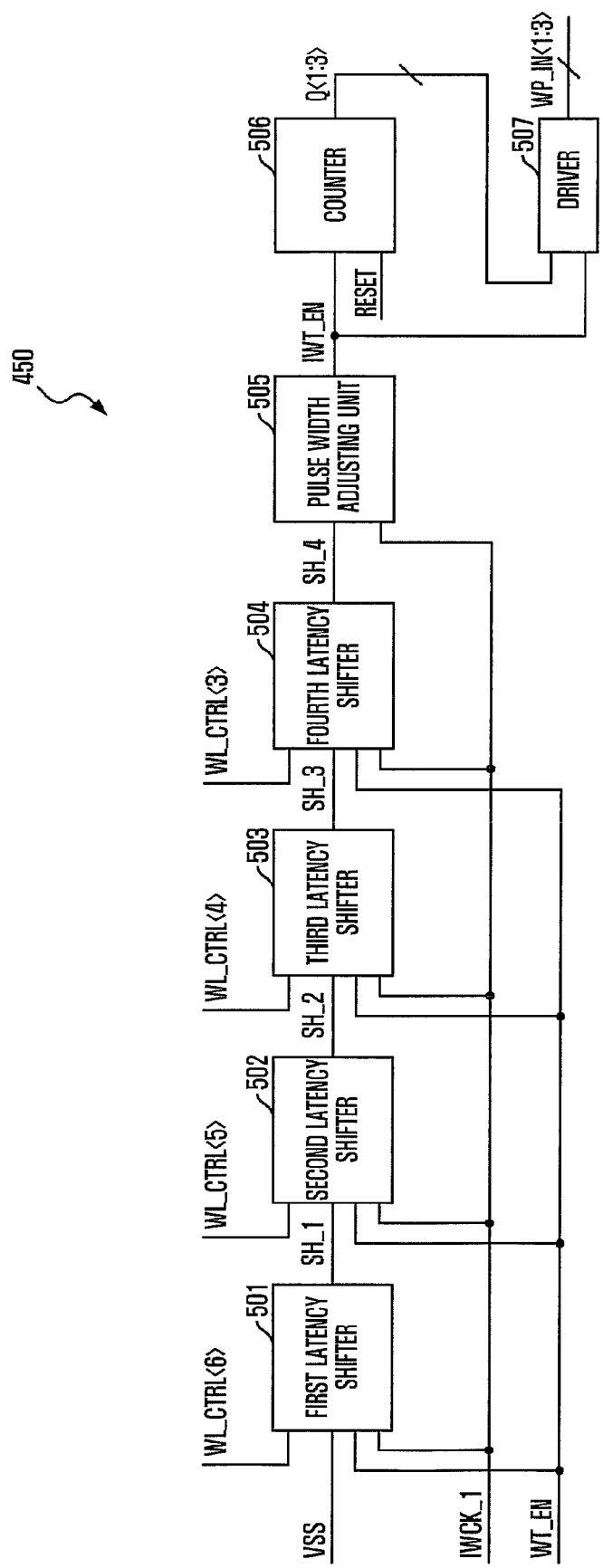
FIG. 5 is a detailed diagram illustrating a data input control unit shown in FIG. 4, in accordance with the one embodiment of the present invention.

FIG. 5 is a detailed diagram illustrating the data input control unit 450 shown in FIG. 4.

Referring to FIG. 5, a case is described as one embodiment, in which the write enable signal WT_EN is enabled during a half-period of the system clock CLK and the data input/output unit 410 includes the first to the third resistors 413, 415, and 417. And, the write latency WL is 3 to 6 and a case corresponding to write latency signals WL_CTRL<3:6>, is described as one embodiment.

As shown, the data input control unit 450 includes first to fourth latency shifters 501 to 504, a pulse width adjusting unit 505, a counter 506, and a driver 507.

The first to the fourth latency shifters 501 to 504 shift the write enable signal WT_EN by a delay value corresponding to the write latency WL in response to the write latency signals WL_CTRL<3:6>. The first to the fourth latency shifters 501 to 504 shift an input signal after synchronizing it with the multi-phase clock IWCK_1 and enable period widths of output signals SH_1 to SH_4 of the first to the fourth latency shifters 501 to 504 to be as much as one period of the multi-phase clock IWCK_1.

The write enable signal WT_EN is inputted to a latency shifter which receives the enabled write latency signal among the write latency signals WL_CTRL<3:6>. And, the write enable signal WT_EN is shifted by the latency shifter receiving the enabled write enable signal and a subsequent latency shifter. That is, the delay value of the write enable signal WT_EN is determined by the number of the latency shifters.

For instance, in case that the write latency signal WL_CTRL<6> is enabled, the write enable signal WT_EN is shifted by being inputted to the first latency shifter 501 and the output signal SH_1 of the first latency shifter 501 is further shifted by the second to the fourth latency shifters, 502 to 504. Namely, in case that the write latency signal WL_CTRL<6> is enabled, the write enable signal WT_EN is shifted by 4 periods of the multi-phase clock IWCK_1. And, in case that the write latency signal WL_CTRL<4> is enabled, the write enable signal WT_EN is shifted by 2 periods of the multi-phase clock IWCK_1.

The number of the latency shifters can be adjusted according to design and the delay value of the write enable signal WT_EN corresponding to the write latency signals WL_CTRL<3:6> can be adjusted according to the number of the latency shifters. The number of the latency shifters can be adjusted in consideration of a time when the data inputted to the data aligning unit 411 are aligned and stored in the first to third resistors 413, 415, and 417, a time when the write command CMD is decoded in the command decoder unit, and so on. For instance, if one latency shifter is additionally connected to an output stage of the fourth latency shifter 504, in case that the write latency signal WL_CTRL<6> is enabled, the data input control 450 by which the write enable signal WT_EN is shifted by 5 periods of the multi-phase clock IWCK_1 can be constructed.

Meanwhile, unlike the second to the fourth latency shifters 502 to 504, the first latency shifter 501 does not receive a shifted write enable signal and therefore it receives a ground voltage VSS and shifts the write enable signal WT_EN. This will be described in more detail with reference to FIG. 6.

The pulse width adjusting unit 505 adjusts an enable period width of the output signal SH_4 of the fourth latency shifter 504 to be the same width as an enable period width of the write enable signal WT_EN. It is because the output signals SH_1 to SH_4 of the latency shifters 501 to 504 are enabled during one period of the multi-phase clock IWCK_1. If the enable period width of the write enable signal, WT_EN is as much as one period of the system clock, the data input control unit 450 may not include the pulse width adjusting unit 505.

The first to the fourth latency shifters 501 to 504 and the pulse width adjusting unit 505 are described in more detail with reference to FIGS. 6 and 7.

The counter 506 generates selection signals Q<1:3> sequentially enabled by counting a shifted write enable signal IWT_EN. Initially, the selection signal Q<1> is enabled through a reset signal RESET and the selection signals Q<2:3> are disabled. Thereafter, if the write enable signal WT_EN is enabled, the selection signal Q<2> is enabled and then if the write enable signal WT_EN is enabled, the selection signal Q<3> is enabled.

The driver 507 enables and outputs the input strobe signals WT_IN<1:3> in response to the shifted write enable signal IWT_EN. Since a bit of each of the selection signals Q<1:3> corresponds to a bit of each of the input strobe signals WT_IN<1:3>, the selection signals Q<1:3>, and the input strobe signals WT_IN<1:3> are sequentially enabled.

Meanwhile, the data input control unit 450 can include the first to fourth latency shifters 501 to 504 and the pulse width adjusting unit 505 without the counter 506 and the driver 507, if the data input/output unit 410 includes one resistor.

Figure 6:
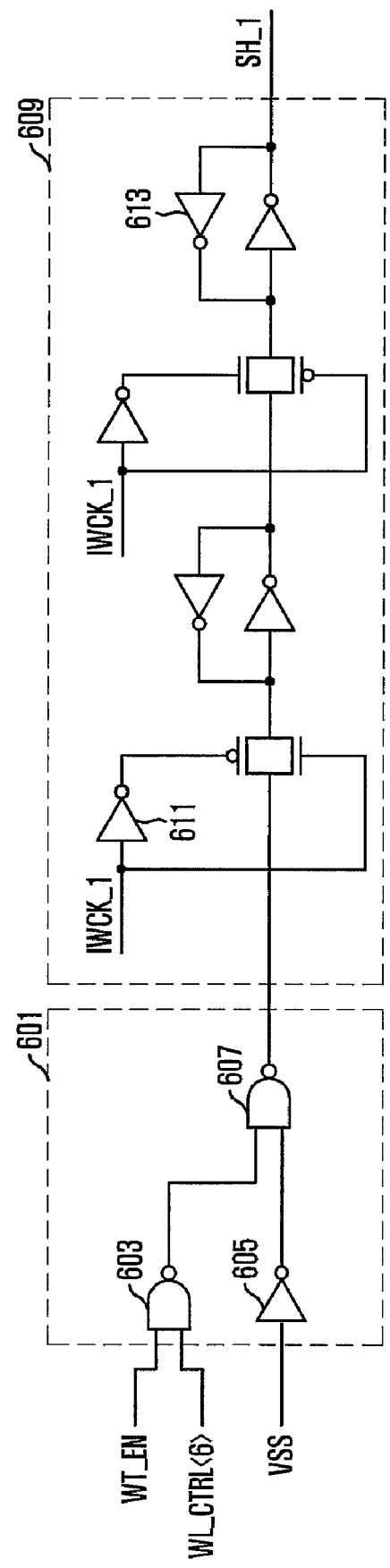
FIG. 6 is a detailed configuration diagram illustrating a first latency shifter shown in FIG. 5.

FIG. 6 is a detailed configuration diagram illustrating the first latency shifter 501 shown in FIG. 5.

Configurations of the second to the fourth latency shifters 502 to 504 are the same as a configuration of the first latency shifter 501 and FIG. 6 is explained laying emphasis on the first latency shifter 501.

As shown, the first latency shifter 501 includes a write enable signal input unit 601 and a flip-flop 609. The write enable signal input unit 601 transmits the enabled write enable signal WT_EN to the flip-flop 609 in response to the write latency signal WL_CTRL<6>. And, the flip-flop 609 shifts an input signal. Hereafter, an operation of the first latency shifter 501 is described in detail.

The write enable signal WT_EN and the write latency signal WL_CTRL<6> are inputted to a first NAND gate 603 and the ground voltage VSS is inputted to a second NAND gate 607 together with an output signal of the first NAND gate 603 by being inverted by an inverter 605.

In case that both of the write enable signal WT_EN and the write latency signal WL_CTRL<6> are enabled to high, the first NAND gate 603 outputs a signal of a low logic level. And, since the second NAND gate 607 receives a signal of a high logic level by the inverter 605, it outputs the signal of the high logic level only if a logic level of the output signal of the first NAND gate 603 is low. That is, the write enable signal input unit 601 transmits the write enable signal WT_EN enabled to high to the flip-flop 609, only if the write latency signal WL_CTRL<6> is enabled to high.

Since a first pass gate 611 of the flip-flop 609 is turned on if a logic level of the multi-phase clock IWCK_1 is high and a second pass gate 613 is turned on if the logic level of the multi-phase clock IWCK_1 is low, the flip-flop 609 shifts the input signal by a half-period of the multi-phase clock IWCK_1. The flip-flop 609 shifts the input signal by the half-period of the multi-phase clock IWCK_1 by corresponding the enable period width of the write enable signal WT_EN to be as much as the half-period of the system clock CLK.

And, an output signal of the flip-flop 609 is enabled to high by one period of the multi-phase clock IWCK_1. The output signal SH_1 of the flip-flop 609 is inputted to the inverter of the write enable signal input unit of the second latency shifter 502.

Since the output sign of the flip-flop 609 is high, the write enable signal input unit of the second latency shifter 502 outputs a signal of a high logic level and the second shifter 502 shifts the output signal SH_1 of the first latency shifter 501 by the one period of the multi-phase clock IWCK_1. And, each of the subsequent latency shifters also shifts an input signal by the one period of the multi-phase clock IWCK_1.

In case that the write latency signal WL_CTRL<5> inputted to the second latency shifter 502 is enabled and the write enable signal WT_EN is enabled, the first latency shifter 501 outputs a signal of a high logic level. However, a write enable signal input unit of the second latency shifter 502 outputs a signal of a high logic level and shifts the enabled write enable signal WT_EN by the half-period of the multi-phase clock IWCK_1. And, each of the subsequent latency shifters shifts the input signal by one period of the multi-phase clock IWCK_1.

In summary, the latency shifter receiving the enabled write latency signals WL_CTRL<3:6> shifts the write enable signal WT_EN by the half-period of the multi-phase clock IWCK_1 and the subsequent latency shifters shift the input signals by the one period of the multi-phase clock IWCK_1.

Figure 7:
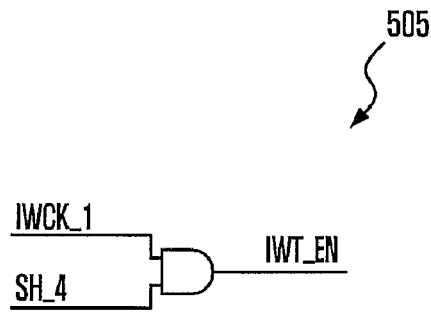
FIG. 7 is a detailed configuration diagram illustrating a pulse width adjusting unit shown in FIG. 5.

FIG. 7 is a detailed configuration diagram illustrating the pulse width adjusting unit 505 shown in FIG. 5.

As shown, the pulse width adjusting unit 505 includes an AND gate receiving an output signal SH_4 of the fourth latency shifter 504 and the multi-phase clock IWCK_1.

As described above, in case that the write enable signal WT_EN is enabled, the output signal SH_4 of the fourth latency shifter 504 is enabled by the one period of the multi-phase clock IWCK_1. Therefore, the output signal IWT_EN of the pulse width adjusting unit 505 is enabled by the half-period of the multi-phase clock IWCK_1 in order to have the same enable period width as the write enable signal WT_EN.

Figure 8:
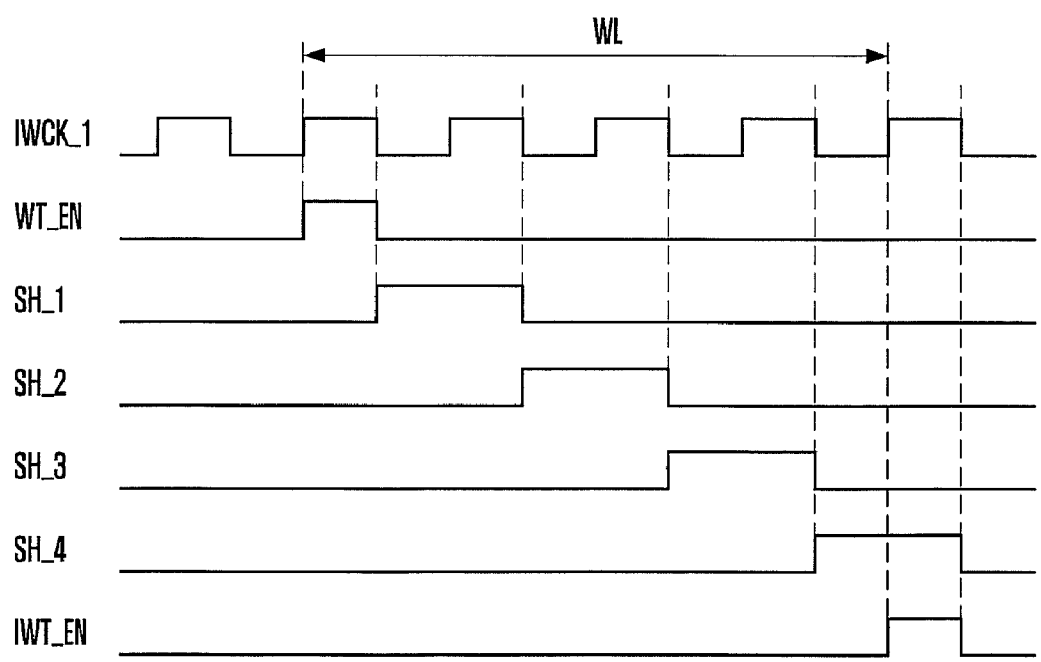
FIG. 8 is a diagram illustrating operations of first to fourth latency shifters and the pulse width adjusting unit shown in FIG. 5.

FIG. 8 is a diagram illustrating operations of the first to fourth latency shifters 501 to 504 and the pulse width adjusting unit 505, shown in FIG. 5.

A case in which the write latency signal WL_CTRL<6> is enabled is shown in FIG. 8 as one embodiment.

The write enable signal WT_EN is enabled to high by the half-period of the multi-phase clock IWCK_1. The first latency shifter 501 shifts the write enable signal WT_EN by the half-period of the multi-phase clock IWCK_1 and the first latency shifter 501 outputs the signal SH_1 enabled to high during the one period of the multi-phase clock IWCK_1 to the second latency shifter 502.

And, each of the second to the fourth latency shifters 502 to 504 shifts the input signal by the one period of the multi-phase clock IWCK_1.

The pulse width adjusting unit 505 outputs a signal enabled to high during the half-period of the multi-phase clock IWCK_1 in response to an enable period of the fourth latency shifter 504 and a high level period of the multi-phase clock IWCK_1.

Finally, as shown in the drawing, the write enable signal WT_EN is shifted by 4 periods of multi-phase clock IWCK_1 corresponding to the write latency signal WL_CTRL<6>.

Figure 9:
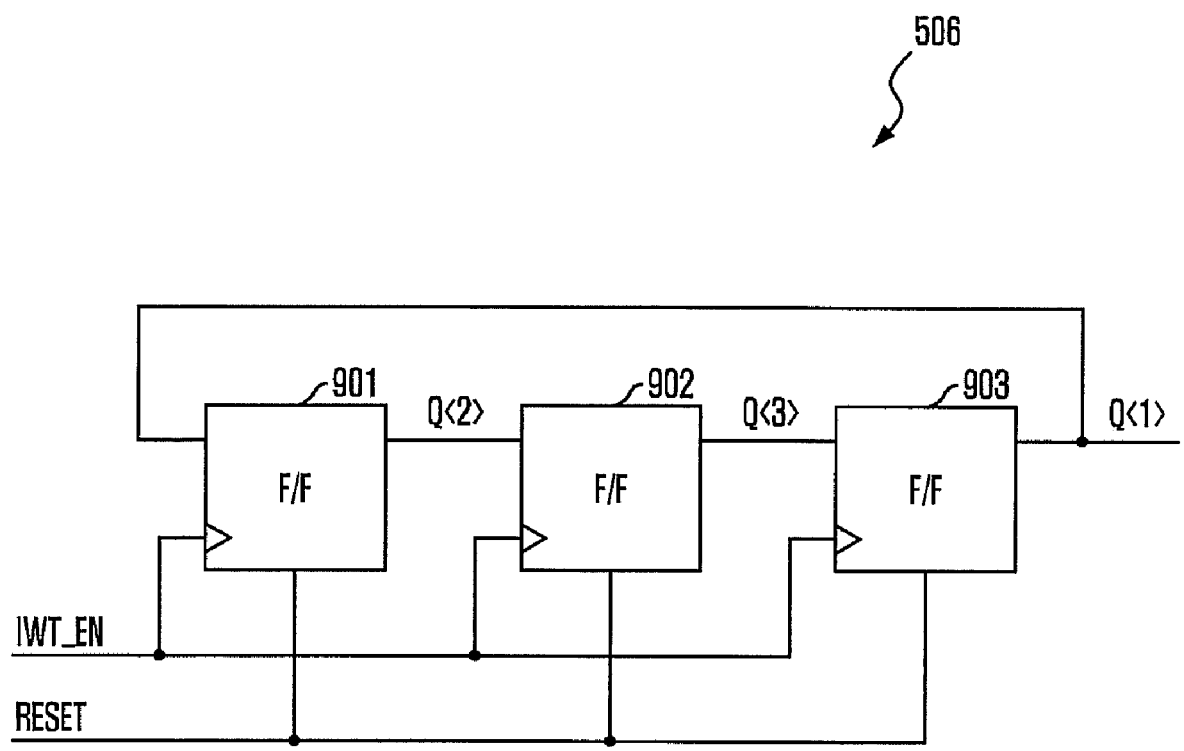
FIG. 9 is a detailed configuration diagram illustrating a counter shown in FIG. 5.

FIG. 9 is a detailed configuration diagram illustrating the counter shown in FIG. 5.

As shown, the counter 506 includes first to third flip-flops 901 to 903.

The first to the third flip-flops 901 to 903 are connected in a ring shape. The first to third flip-flops 901 to 903 are initially enabled to high and thereafter they receive a reset signal RESET for maintaining a state in which they are disabled to low. The second and third selection signals Q<2:3> are maintained in a state in which they are disabled to high by the reset signal RESET and the first selection signal Q<1> is maintained in a state in which it is enabled to low.

Thereafter, if the shifted write enable signal IWT_EN is enabled to high and then disabled to low, the first to the third flip-flops 901 to 903 latch input signals in response to a falling edge of the shifted write enable signal IWT_EN. Therefore, the first and third selection signals Q<1> and Q<3> are converted to a state in which they are disabled to high and the second selection signal Q<2> are converted to a state in which it is enabled to low.

Thereafter, if the write enable signal IWT_EN, which is shifted again is enabled to high and then disabled to low, the first and second selection signals Q<1:2> are converted to a state in which they are disabled to high and the third selection signal Q<3> are converted to a state in which it is enabled to low.

Finally, the first to the third selection signals Q<1:3> are sequentially enabled whenever the shifted write enable signal IWT_EN is enabled and then disabled.

Figure 10:
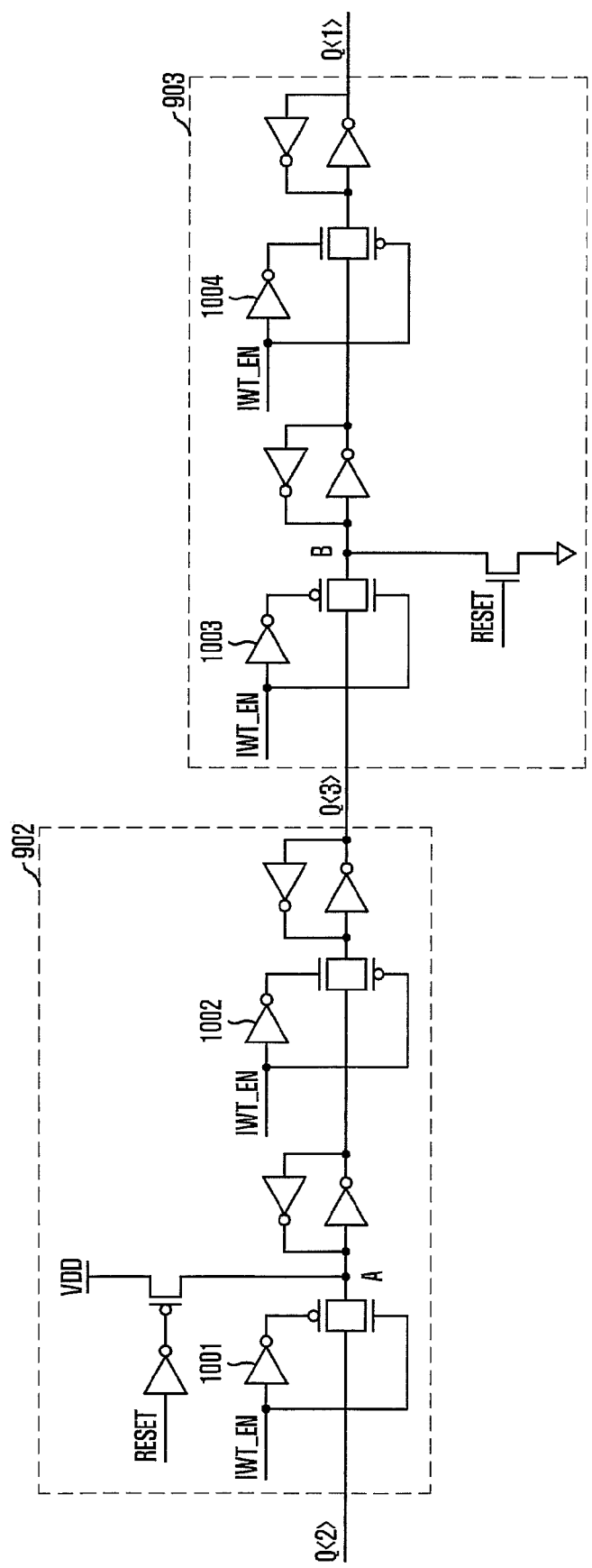
FIG. 10 is a detailed configuration diagram illustrating second and third flip-flops shown in FIG. 9.

FIG. 10 is a detailed configuration diagram illustrating the second and third flip-flops 902 and 903, shown in FIG. 9.

Since a configuration of the first flip-flop 901 is the same as that of the second flip-flop 902, FIG. 10 is explained laying emphasis on the second flip-flop 902.

If the reset signal RESET is changed from a high enable state to a low disable state, a logic level of an A node is maintained high by a p-type Metal-Oxide-Semiconductor (p-MOS) transistor and an n-type Metal-Oxide-Semiconductor (n-MOS) transistor, and a logic level of a B node is maintained low. First and second pass gates 1001 and 1002 are turned on, if the shifted write enable signal IWT_EN is enabled to high. Third and fourth pass gates 1003 and 1004 are turned on if the shifted write enable signal IWT_EN is disabled to low.

Therefore, since the third and fourth pass gates 1003 and 1004 are turned on in a state in which the shifted write enable signal IWT_EN is disabled to low, the selection signal Q<1> is enabled to low and the selection signal Q<3> is disabled to high. Thereafter, if the shifted write enable signal IWT_EN is enabled to high and then disabled to low, the second and third flip-flops 902 and 903 latches input signals at a falling edge of the shifted write enable signal IWT_EN.

Namely, the selection signal Q<1> is disabled to high. And, the second flip-flop 902 receives the selection signal Q<2> outputted by the first flip-flop 901, and therefore the selection signal Q<3> maintains the state in which it is enabled to high. The second flip-flop 902 receives the selection signal Q<1>, and therefore the selection signal Q<2> is enabled to low.

Figure 11:
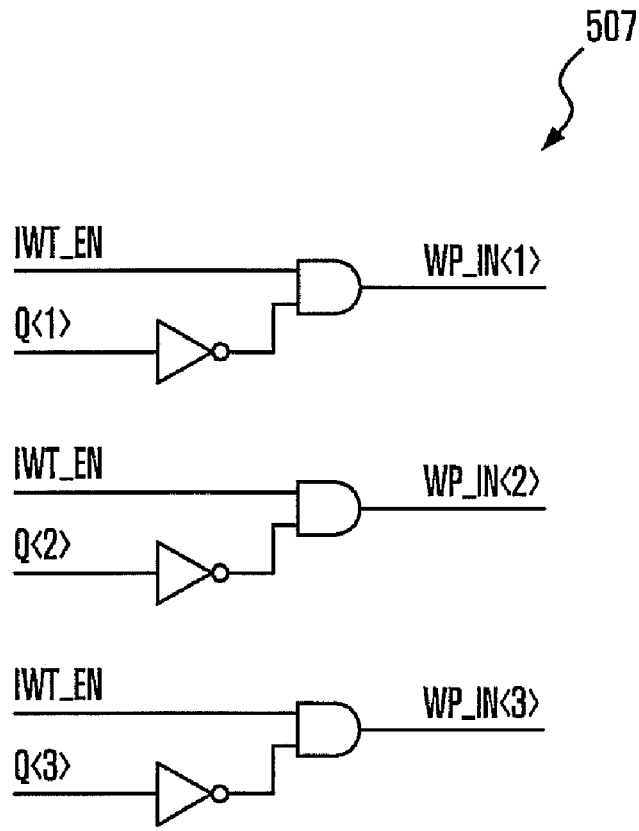
FIG. 11 is a detailed configuration diagram illustrating a driver shown in FIG. 5.

FIG. 11 is a detailed configuration diagram illustrating the driver 507 shown in FIG. 5.

As shown, the driver 507 includes a plurality of AND gates which receive the shifted write enable signals IWT_EN and the selection signals Q<1:3>.

As described above, the first selection signal Q<1> is enabled to low and the selection signals Q<2:3> are disabled to high. And, the selection signals are sequentially enabled in response to falling edges of the shifted write enable signals IWT_EN. Furthermore, the selection signals Q<1:3> are inputted to the AND gates by being inverted by an inverter.

Therefore, if the first shifted write enable signal IWT_EN is enabled to high, the input strobe signal WP_IN<1> is enabled to high by being synchronized with the shifted write enable signal IWT_EN, and then the input strobe signals WP_IN<2:3> are sequentially enabled to high by being synchronized with the shifted write enable signals IWT_EN.

As described above, the data input control unit 450 is described with reference to FIGS. 5 to 11. The core control unit 421 can include the latency shifters 501 to 504 of the data input control unit and the pulse width adjusting unit 505. At this time, the core control unit 421 receives the system clock CLK instead of the multi-phase clock IWCK_1.

And, the data output control unit 423 can include the counter 506 of the data input control unit 450 and the driver 507. At this time, the data output control unit 423 receives the first core enable signal DINSTB_1 instead of the shifted write enable signal IWT_EN. And, the data output control unit 423 further includes a delay device for delaying the output strobe signals WP_OUT<1:3> by a predetermined time DD.

Figure 12:
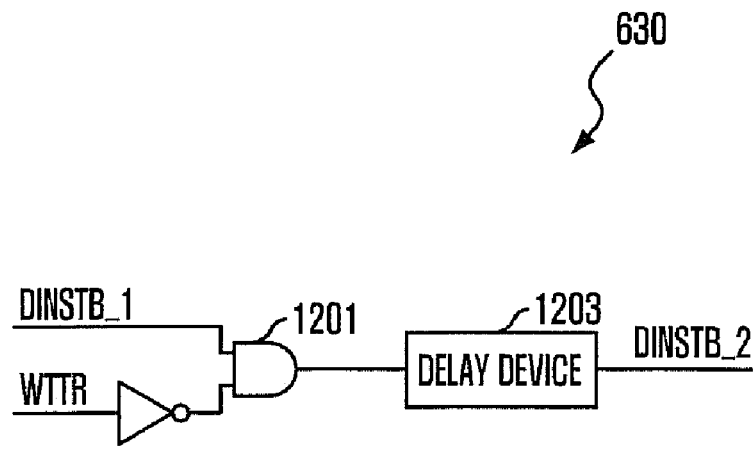
FIG. 12 is a detailed diagram illustrating a core enable signal control unit shown in FIG. 4.

FIG. 12 is a detailed diagram illustrating the core enable signal control unit 430 shown in FIG. 4.

As shown, the core enable signal control unit 430 includes an AND gate 1201 for receiving the first core enable signal DINSTB_1 and inverting and receiving the write training signal WTTR and a delay device 1203 for delaying an output signal of the AND gate 1201 by a predetermined time DD.

The first core enable signal DINSTB_1 is inputted to the AND gate 1201 together with the inverted write training signal. Therefore, although the first core enable signal DINSTB_1 is enabled to high, the core enable signal control unit 430 outputs the disabled second core enable signal DINSTB_2 to the memory cell if the write training signal WTTR is not disabled to low. In the event that the write training signal WTTR is designed to be enabled to low in the write training mode, it is preferable that the AND gate 1201 receives an uninverted write training signal.

The delay device 1203 corresponds to the delay device of the data output control unit 423 in order to match timing between the data outputted from the data input/output unit 410 and the second core enable signal DINSTB_2, as described above.

Figure 13:
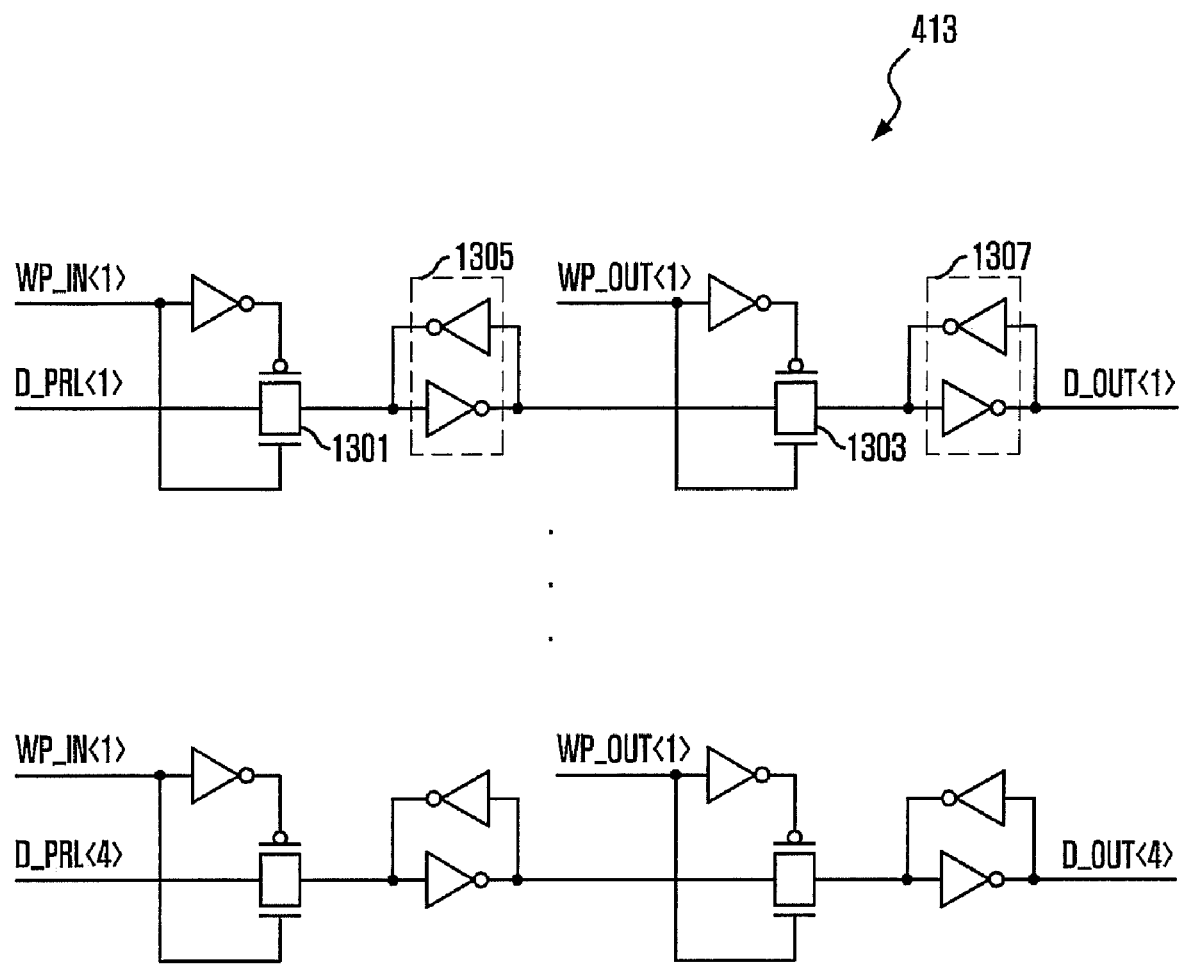
FIG. 13 is a detailed configuration diagram illustrating a first resistor of a data input/output unit shown in FIG. 4.

FIG. 13 is a detailed configuration diagram illustrating the first resistor 413 of the data input/output unit 410, shown in FIG. 4.

Configurations of the second and third resistors 415 and 417 are the same as that of the first resistor 413 and so FIG. 13 is explained laying emphasis on the first resistor 413.

As shown in FIG. 13, the first resistor 413 includes a first pass gate 1301 turned on/off in response to the input strobe signal WP_IN<1>, a second pass gate 1303 turned on/off in response to the output strobe signal WP_OUT<1>, and a plurality of latch units 1305 and 1307 for latching output signals of the first and second pass gates 1301 and 1303. And, as described above, since the semiconductor memory device using the 4-bit prefetch method is described as one embodiment, the first resistor 413 includes the first pass gate 1301, the second pass gate 1303, and the plurality of latch units 1305 and 1307 corresponding to the 4-bit parallel data D_PRL<1:4>.

Hereafter, a process step of 1-bit parallel data D_PRL<1> will be described. The other parallel data D_PRL<2:4> is processed by the same process.

If the input strobe signal WP_IN<1> is enabled to high, the first pass gate 1301 is turned on in order to store the parallel data D_PRL<1> in the latch unit 1305. And, if the output strobe signal WP_OUT<1> is enabled to high, the second pass gate 1303 is turned on in order to store and output the data stored in the latch unit 1305 in the latch unit 1307.

Figure 14A:
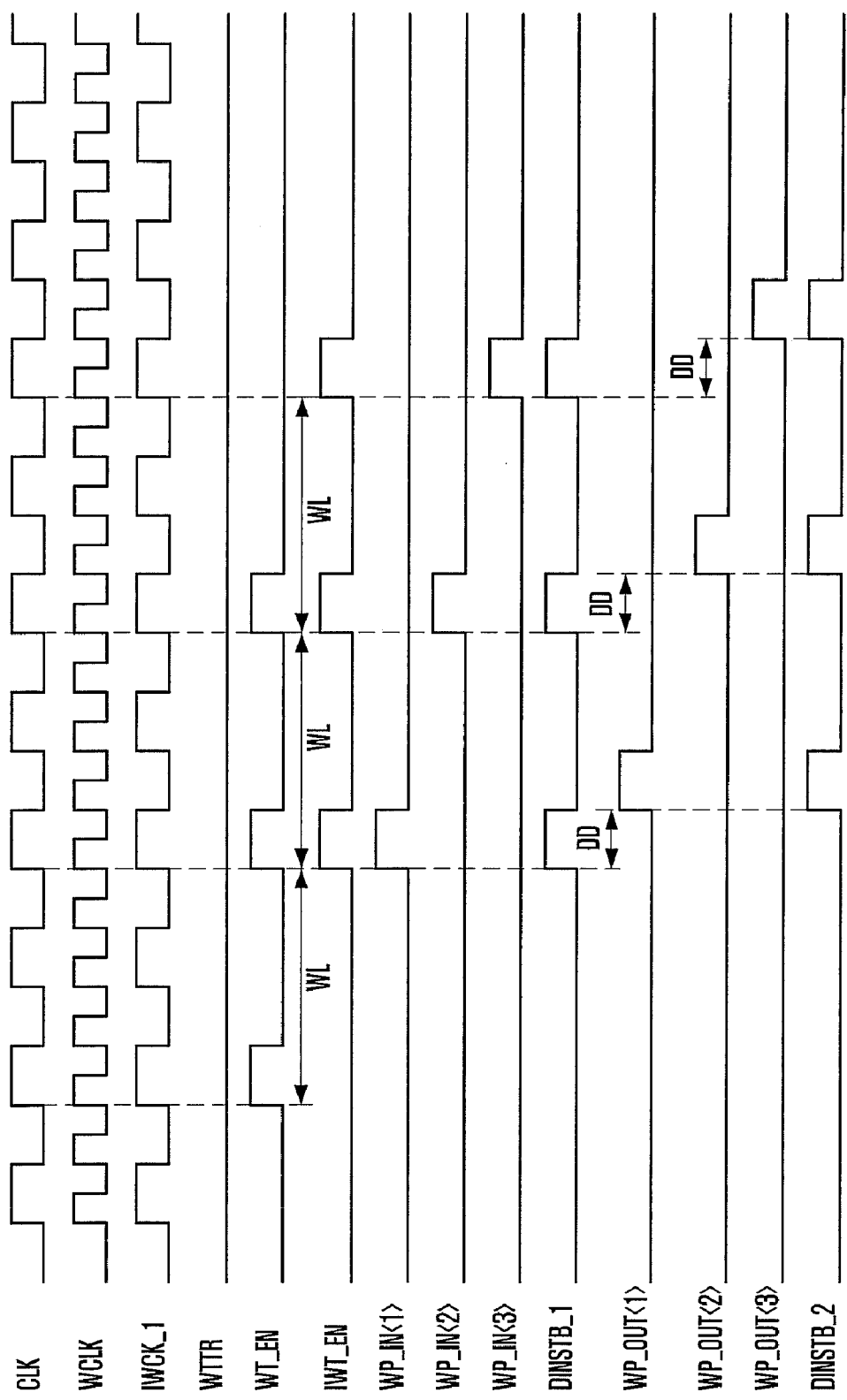
FIGS. 14A and 14B are timing diagrams illustrating an operation of the semiconductor memory device in accordance with one embodiment of the present invention.
Figure 14B:
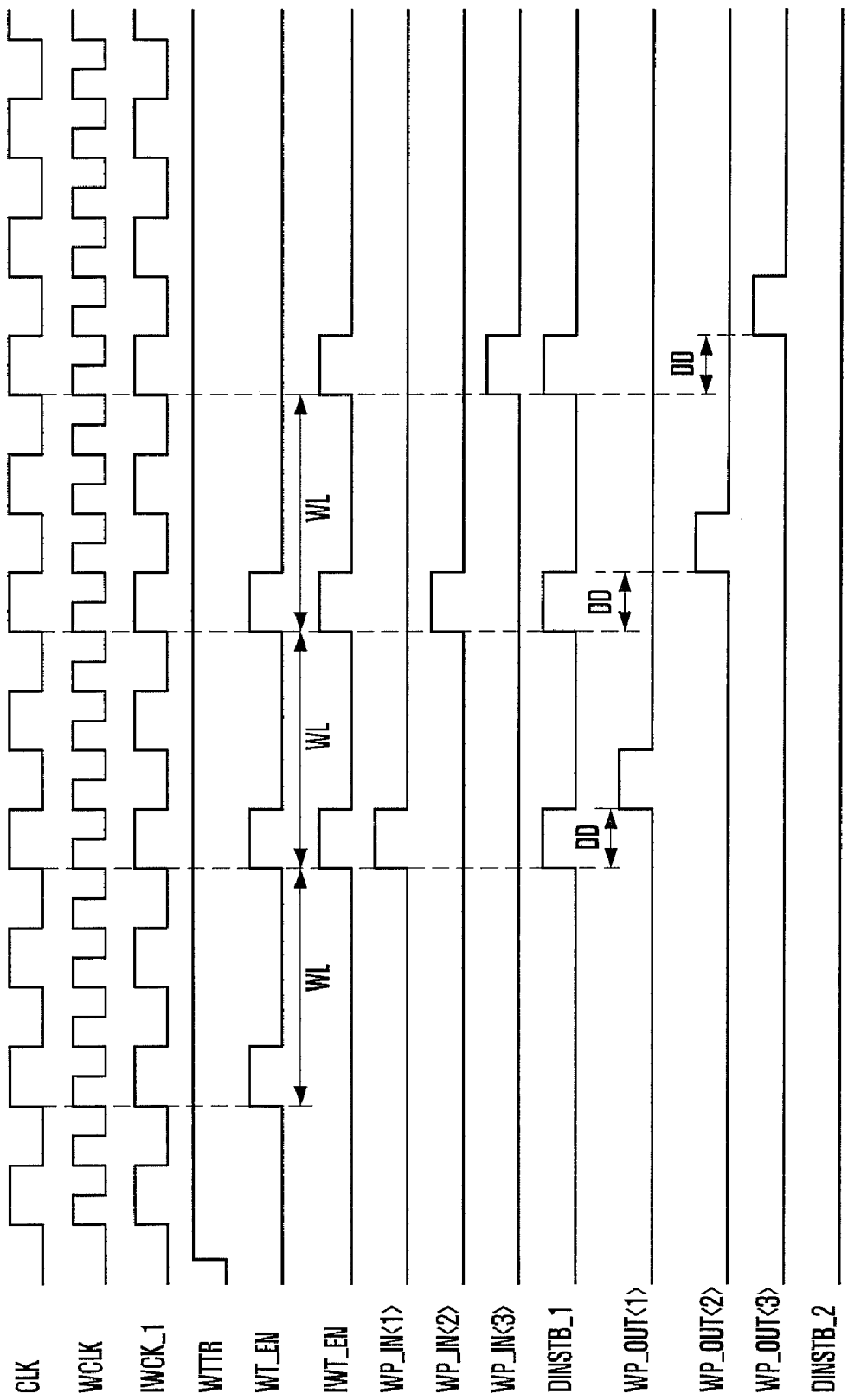

FIGS. 14A and 14B are timing diagrams illustrating an operation of the semiconductor memory device in accordance with one embodiment of the present invention.

FIG. 14A is a timing diagram illustrating an operation of the semiconductor memory device in the normal write operation and FIG. 14B is a timing diagram illustrating an operation of the semiconductor memory device in the write training operation. To provide a better understanding, a case in which phases of the system clock CLK, the data clock WCLK, and the multi-phase clock IWCK_1 are matched is shown in FIGS. 14A and 14B.

Referring to FIG. 14A, the write enable signal WTTR is disabled to low and the semiconductor memory device performs the normal write operation.

The latency shifters 501 to 504 and the pulse width adjusting unit 505 of the data input control unit 450 shift the write enable signal WT_EN by the write latency WL and output the shifted write enable signal IWT_EN with the same enable period width as the write enable signal WT_EN. And the counter 506 and the driver 507 output the sequentially enabled input strobe signals WP_IN<1:3>.

The core control unit 421 also shifts the write enable signal WT_EN by the write latency WL in order to output the first core enable signal DINSTB_1. And, the data output control unit 423 delays the first core enable signal DINSTB_1 by the predetermined time DD in order to output the sequentially enabled output strobe signals WP_OUT<1:3>.

Meanwhile, since the write training signal WTTR is disabled, the core enable signal control unit 430 outputs the enabled second enable signal DINSTB_2 to the memory cell.

Referring to FIG. 14B, the write enable signal WTTR is enabled to high and the semiconductor memory device performs the write training operation.

As shown in FIG. 14B, the semiconductor memory device in accordance with the present invention operates similarly to the case in which it performs the normal write operation. Only, the core enable signal control unit 430 outputs the disabled second core enable signal DINSTB_2 to the memory cell in response to the write training signal WTTR.

Therefore, in the write training operation, the domain crossing occurs in the data input/output unit 410 and the data outputted from the data input/output unit 410 are not stored in the memory cell.

As described above, the present invention is described in terms of the device and an operation of each of the components constituting the semiconductor memory device in accordance with the present invention can be easily understood in terms of a process. Therefore, the operation of each of the components constituting the semiconductor memory device in accordance with the present invention can be understood as each step constituting a method for operating the semiconductor memory device according to the principle of the present invention. Hereafter, the method for operating the semiconductor memory device will be described with reference to FIGS. 2 to 14B.

In accordance with another embodiment of the present invention, the method for operating the semiconductor memory device includes: generating a write enable signal WT_EN and a write training signal WTTR enabled in a write training mode in response to a write command CMD inputted from an outside; generating a core enable signal DINSTB_1 synchronized with a system clock in response to the write enable signal WT_EN, regardless of the write training mode; generating an output strobe signal WP_OUT by delaying the core enable signal DINSTB_1 by a predetermined time DD; disabling the core enable signal DINSTB_1, according to the write training mode in order to output the disabled core enable signal to the memory cell; generating multi-phase clocks IWCK_1 to IWCK_4 by dividing a data clock WCLK; generating an input strobe signal WP_IN, synchronized with the multi-phase clock IWCK_1 in response to the write enable signal WT_EN; and receiving and storing data DATA in response to the input strobe signal WP_IN and outputting the stored data to the memory cell in response to an output strobe signal WP_OUT.

The output strobe signal WP_OUT is generated by delaying the core enable signal DINSTB_1 by a predetermined time DD in order to secure a time when the inputted data are stored in response to the input strobe signal WP_IN. And, the core enable signal DINSTB_1 is delayed by a predetermined time DD and transmitted to the memory cell in order to match timing between the data inputted to the memory cell and a core enable signal DINSTB_2.

Meanwhile, each of the core enable signal DINSTB_1 and the input strobe signal WP_IN is generated by being delayed from the write enable signal WT_EN as much as write latency WL by being reflected by the write latency WL.

In accordance with the present invention, the data output error that may occur in the domain crossing operation due to the phase mismatch between the system clock and the data clock in the normal write operation can be prevented by performing the clock training again if the data output error occurs due to the domain crossing by causing the domain crossing in the write training operation.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a data input/output unit configured to input data synchronously with a data clock and to output the data to a memory cell in response to an output strobe signal; and
an output strobe signal generation unit configured to output the output strobe signal, wherein the output strobe signal is synchronized with a system clock in response to a write command.

2. The semiconductor memory device of claim 1, wherein the output strobe signal generation unit includes:
a core control unit configured to output a core enable signal synchronized with the system clock in response to the write command, the memory cell being enabled by the core enable signal; and
a data output control unit configured to delay the core enable signal by a predetermined time and output the delayed core enable signal as the output strobe signal in order to secure a time when the data is stored in the data input/output unit.

3. The semiconductor memory device of claim 2, wherein the core control unit is configured to delay and output the core enable signal in response to write latency.

4. The semiconductor memory device of claim 2, further comprising:
a core enable signal control unit configured to delay the core enable signal by a predetermined amount and to output the delayed core enable signal to the memory cell.

5. The semiconductor memory device of claim 4, wherein the core enable signal control unit is configured to disable the core enable signal in a write training mode and to output the core enable signal to the memory cell.

6. The semiconductor memory device of claim 4, wherein the core enable signal control unit includes:
an AND gate configured to receive a write training signal for informing of the write training mode and the core enable signal; and
a delay device configured to delay an output signal of the AND gate by the predetermined time in order to output the delayed output signal.

7. The semiconductor memory device of claim 1, wherein a frequency of the data clock is two times higher than a frequency of the system clock.

8. A semiconductor memory device, comprising:
a data input/output unit configured to receive and store data in response to an input strobe signal and to output the stored data to a memory cell in response to an output strobe signal;
a clock dividing unit configured to output multi-phase clocks by dividing a data clock;
a data input control unit configured to output the input strobe signal, wherein the input strobe signal is synchronized with the multi-phase clocks, in response to a write enable signal; and
an output strobe signal generation unit configured to output the output strobe signal, wherein the output strobe signal is synchronized with a system clock, in response to the write enable signal.

9. The semiconductor memory device of claim 8, wherein the output strobe signal generation unit includes:
a core control unit configured to output a core enable signal synchronized with the system clock in response to the write enable signal, the memory cell being enabled by the core enable signal; and
a data output control unit configured to delay the core enable signal by a predetermined time and output the delayed core enable signal as the output strobe signal in order to secure a time when the data is stored in the data input/output unit.

10. The semiconductor memory device of claim 9, wherein the core control unit and the data input control unit are configured to delay and output the core enable signal and the input strobe signal, respectively, by being reflected by write latency.

11. The semiconductor memory device of claim 10, wherein each of the core control unit and the data input control unit includes:

a plurality of latency shifters, each of said plurality of latency shifters being connected in series and configured to delay the write enable signal in response to the write latency in order to individually output the core enable signal and the input strobe signal; and a pulse width adjusting unit configured to adjust an enable period width of each of the core enable signal and the input strobe signal.

12. The semiconductor memory device of claim 11, wherein each of the latency shifters includes:

a write enable signal input unit configured to transmit the write enable signal in response to the write latency; and a flip-flop configured to receive and shift a signal transmitted by the write enable signal input unit.

13. The semiconductor memory device of claim 8, wherein the data input/output unit includes:

a data aligning unit configured to align the data inputted in series in parallel in response to the multi-phase clocks; and at least one resistor configured to receive and store the parallel data in response to the input strobe signal and to output the stored parallel data in response to the output strobe signal.

14. The semiconductor memory device of claim 13, wherein the at least one resistor includes:

a first pass gate turned on or off in response to the input strobe signal;

a second pass gate turned on or off in response to the output strobe signal; and a plurality of latch units configured to latch output signals of the first and second pass gates.

15. The semiconductor memory device of claim 8, wherein the clock dividing unit is configured to divide the data clock into two and to output the multi-phase clocks with phase differences from adjacent clocks by 90°.

16. The semiconductor memory device of claim 9, further comprising:

a core enable signal control unit configured to delay the core enable signal by the predetermined time and to output the delayed core enable signal to the memory.

17. The semiconductor memory device of claim 16, wherein the core enable signal control unit is configured to disable the core enable signal in response to a write training signal for informing of the write training mode and to output the core enable signal to the memory cell.

18. The semiconductor memory device of claim 16, wherein the core enable signal control unit includes:

an AND gate configured to receive the write training signal for informing of the write training mode and the core enable signal; and a delay device configured to delay an output signal of the AND gate by a predetermined time in order to output the delayed output signal.

19. The semiconductor memory device of claim 8, further comprising:

a command decoder unit configured to output the write enable signal and the write training signal for informing of the write training mode in response to a write command inputted from an outside.

20. The semiconductor memory device of claim 8, wherein a frequency of the data clock is two times higher than a frequency of the system clock.

21. A method for operating a semiconductor memory device, comprising:

generating a write enable signal and a write training signal enabled in a write training mode in response to a write command;

generating a core enable signal, wherein the core enable signal is synchronized with a system clock in response to the write enable signal;

generating an output strobe signal by delaying the core enable signal by a predetermined time;

disabling the core enable signal based on the write training mode in order to transmit the disabled core enable signal to a memory cell, wherein the memory cell is enabled by the enabled core enable signal;

generating multi-phase clocks by dividing a data clock;

generating an input strobe signal synchronized with the multi-phase clocks in response to the write enable signal; and receiving and storing data in response to the input strobe signal and outputting the stored data to the memory cell in response to the output strobe signal.

22. The method of claim 21, wherein the core enable signal is delayed by the predetermined time in order to secure a storage time of the inputted data in response to the input strobe signal in generating the output strobe signal.

23. The method of claim 22, wherein the core enable signal is delayed by the predetermined time in disabling the core enable signal in order to output the disabled core enable signal to the memory cell.

24. The method of claim 21, wherein each of the core enable signal and the input strobe signal is delayed and generated by reflecting write latency in generating the core enable signal and generating the input strobe signal respectively.

* * * * *